United States Patent
Cushing et al.

(10) Patent No.: US 6,614,221 B2
(45) Date of Patent: Sep. 2, 2003

(54) DESKEW FIXTURE

(75) Inventors: Kelly F. Cushing, Portland, OR (US); Mark W. Nightingale, Washougal, WA (US); John F. Stoops, Portland, OR (US); John C. Calvin, Portland, OR (US); Marc A. Gessford, Portland, OR (US); Marie Ottum, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/150,397

(22) Filed: May 17, 2002

(65) Prior Publication Data

US 2003/0128023 A1 Jul. 10, 2003

Related U.S. Application Data

(60) Provisional application No. 60/346,783, filed on Jan. 7, 2002.

(51) Int. Cl.[7] .............................................. G01R 31/02
(52) U.S. Cl. ................. 324/158.1; 324/72.5; 324/121 R
(58) Field of Search .................................. 324/754, 761, 324/158.1, 646, 76, 121 R, 72.5; 714/700; 333/111; 702/89

(56) References Cited

U.S. PATENT DOCUMENTS

| | | | | |
|---|---|---|---|---|
| 4,099,120 A | * | 7/1978 | Aksu ............................ | 324/761 |
| 4,841,231 A | * | 6/1989 | Angelucci .................... | 324/528 |
| 5,068,600 A | * | 11/1991 | Hilz et al. ................... | 324/755 |
| 6,486,686 B1 | * | 11/2002 | Fukasawa .................... | 324/754 |

* cited by examiner

Primary Examiner—Kamand Cuneo
Assistant Examiner—Tung X. Nguyen
(74) Attorney, Agent, or Firm—William K. Bucher

(57) ABSTRACT

A deskew fixture has a multilayer circuit board from which pairs of mirrored signal launch contact extend from both sides of the circuit board. One pair of contacts is coupled to electrical ground and the other pair is connected via equal length, electromagnetically coupled strip lines to a signal source. Probe holders are mounted on the circuit boards to support measurement probes with the probing contacts of the measurement probes coupled to the signal launch contacts. Additional pairs of signal launch contacts may be provided with one pair receiving a positive signal from the signal source and another pair receiving a negative signal via equal length, electromagnetically coupled strip lines from the signal source for deskewing differential measurement probes.

30 Claims, 8 Drawing Sheets

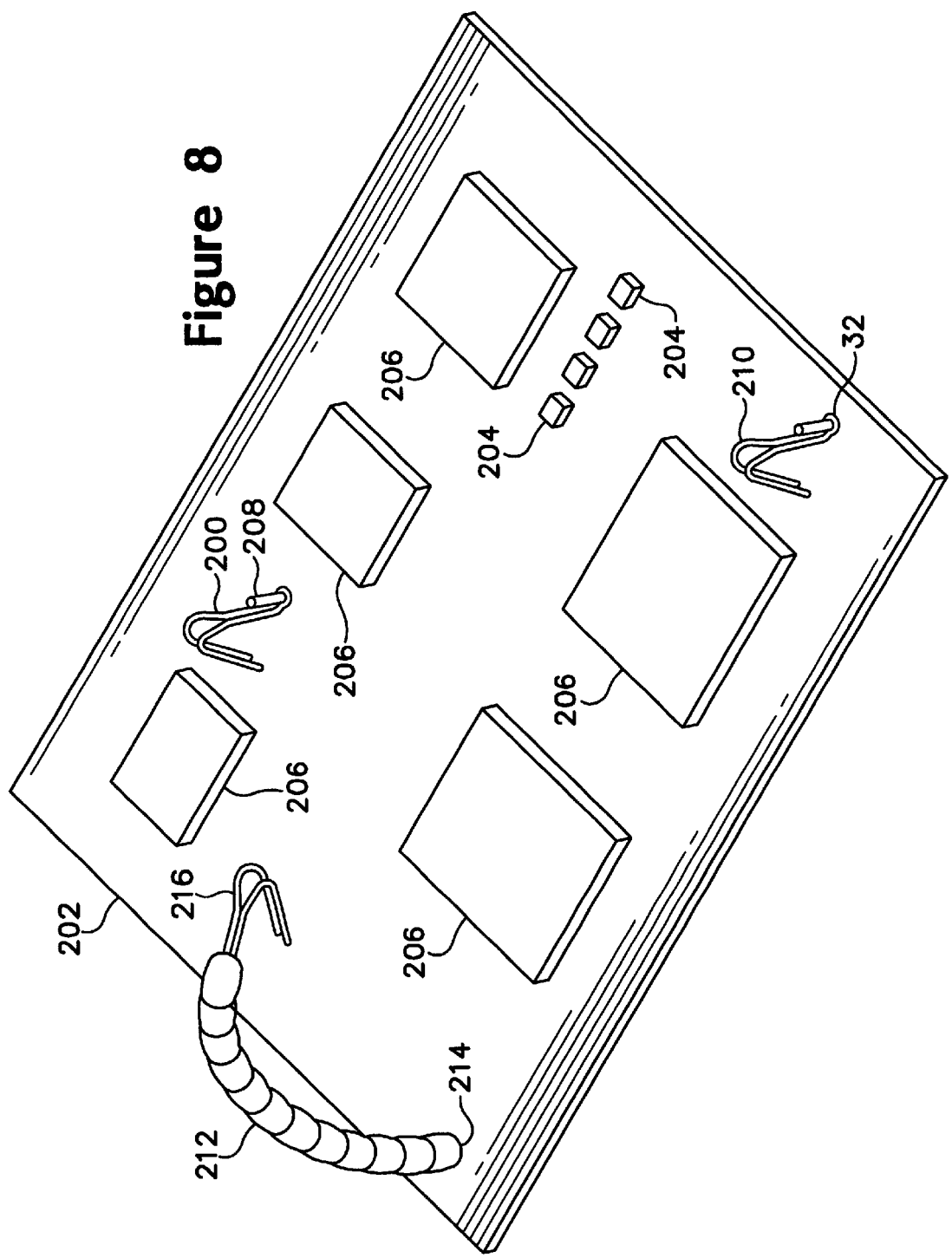

DESKEW FIXTURE

CROSS-REFERENCE TO RELATED APPLICATION

This application claims the benefit of the U.S. Provisional Application No. 60/346,783, filed Jan. 7, 2002.

BACKGROUND OF THE INVENTION

The present invention generally relates to fixtures used for time aligning signal channels of measurement instruments and more particularly to a deskew fixture for time aligning signal channels to the probing tips of measurement probes connected to the signal channels of one or more oscilloscopes.

Oscilloscopes are used for acquiring, processing and displaying electrical signals from a device under test. Oscilloscopes generally have multiple signal channels for acquiring and displaying multiple signals from the device under test. Each signal channel is coupled to the device under test via a measurement probe. In many measurement applications, a user needs to know the timing relationship between signals being measured. Timing delay differences between the signal channels obscure the timing relationship between the signals being measured. It is therefore necessary to time align or deskew the signal channels for accurate timing measurements.

Tektronix, Inc., Beaverton, Oreg., a manufacturer of oscilloscopes, manufactures a deskew fixture under Part No. 067-0405-02 for time aligning the signal channels of their oscilloscopes to the measurement probe tip. The deskew fixture has a housing supporting a circuit board from which extend four sets of square pin connectors. Each set of connectors has a pair of equal height connectors and a pair of unequal height connectors. One of the equal height connectors in each set is coupled to a ground while the other is coupled to an external input signal. The shorter of the unequal height square pins of each set is also coupled to the external signal while the longer square pin is coupled to ground. A BNC type connector is mounted to the housing for coupling the external input signal to the deskew fixture. The center conductor of the BNC connector is coupled by a circuit run formed on the circuit board to a termination jumper. The termination jumper consists of a pair of square pin connectors extending from the circuit board. A termination jumper resistor, such as a 50 ohm resistor, is positioned on the termination jumper. Equal length circuit board runs extend from the termination jumper to the four sets of square pin connectors.

The above described deskew fixture is designed for hands free deskewing of signal channels in which the measurement probes have socket type probing tips or needle type probing tips with socket type probe tip adapters. The equal length square pins are used where the signal probe tip and the ground tip extend the same distance from the measurement probe. The unequal height square pins are used where the probing tip extends from the end of the measurement probe and the ground tip extends from the measurement probe at a distance back of the probing tip. One of the signal channels is designated the reference signal channel and all other channels are time aligned or deskewed to that channel. The external input signal is applied to the deskew fixture and the measurement probe of the reference channel is connected to one of the pairs of the square pin connectors. The measurement probe of the signal channel to be time aligned with the reference channel is connected to one of the other pairs of square pin connectors. Each oscilloscope signal channel has a channel-to-channel deskew range that allows the channels to be time aligned. For example, the TDS7000 Series digital oscilloscopes, manufactured and sold by Tektronix, Inc., have a deskew range of ±25 nsec. The TDS7000 Series oscilloscopes have software routines that adjust the acquired digital samples of the input signals from the various signal channels to display the signals in a time aligned manner. Controls on the oscilloscope are used to deskew the signal channels. It is also possible to use variable delay lines in the various signal channels to time align the signal channels.

A drawback to the above described deskew fixture is that measurement probes with needle type probing tips without socket type adapters require the use of probing stations to connect the measurement probes to the deskew fixture. The measurement probes are secured to probing arms of the probing station and the probing arms are positioned to connect the signal probing tips to the square pin connectors having the external input signal. The ground contacts of the measurement probes may be directly connected to the ground square pins if the spacing between the signal probing tips and the ground contacts are the same as the spacing of the square pin connectors. If such is not the case, then ground connection adapters are required to connect the probe ground contacts to the square pin grounds. The need for probing stations is an added cost to the deskew fixture as well as additional time to setup the probing stations to perform the deskew function. A further drawback to the above described deskew fixture is the inability to deskew differential probes that require both a positive and negative signals.

What is needed is a deskew fixture that allows hands free time aligning or deskewing of signal channels of an oscilloscope that are connected to measurement probes having various types of probing tips. The deskew fixture should easily accept measurements probes having needle type probing tips as well as socket type probing tips. The deskew fixture should also easily accept differential measurement probes having either type of probing tip. The deskew fixture should further minimize signal delays propagating through the fixture so that each of the probe tip contacts receive the deskew fixture signal or signals at the same time.

SUMMARY OF THE INVENTION

Accordingly, the present invention is a deskew fixture for time aligning signal channels of a measurement instrument that are connected to measurement probes having probing contacts. The deskew fixture has a multilayer circuit board having opposing sides with pairs of mirrored signal launch contacts disposed on the opposing sides of the circuit board. A first pair of the contacts are coupled to electrical ground and a second pair of contacts are connected via equal length, electromagnetically coupled strip lines to a signal source. The deskew fixture has at least first and second probe holders for supporting the measurement probes on the circuit board. One of the probe holders is disposed on one side of the circuit board and the other probe holder is disposed on the other side of the circuit board with the probing contacts of the measurement probes coupled to the signal launch contacts.

The signal launch contacts are preferably square pin contacts extending from the opposing sides of the circuit board with contact pads formed adjacent to and electrically coupled to the square pins contacts. Alternately, the signal launch contacts may include just the square pin contact or the contact pads. One embodiment of the probe holder includes a support member extending from the side of the circuit board for supporting the measurement probe. A biasing spring extends from the side of the circuit board adjacent to the support member for applying a force on the measurement probe to capture the measurement probe between the support member and the spring. The biasing spring includes a cantilever spring member having a slot formed therein defining first and second cantilever springs extending from a spine member. A support member extends in an approximate vertical direction from the spine m ember and has a slot formed therein axially aligned with the cantilever spring member slot defining first and second cantilever spring supports. A detent member extends into the slot. The cantilever spring member is positioned in an elongated slot formed in the circuit board such that the first and second cantilever springs are positioned on the opposing sides of the circuit board and the detent member is received in a detent aperture formed in the circuit board. A second embodiment of the probe holder has a multiple folded spring wire forming an attachment member connected by support members to spring tensioned support arms with one end of the spring tensioned support arms flared outward for receiving the measurement probe. Multiple probe holders may be disposed on each side of the circuit board.

The signal source is preferably mounted on the circuit board with the signal source generating positive and negative signals. The second pair of signal launch contacts receive the positive signal and a third pair of contacts receives the negative signal via equal length, electromagnetically coupled strip lines connected to the signal source. A voltage input connector is mounted on the circuit board that receives voltage power inputs which are coupled to the signal source. The voltage input connector is preferably a USB connector. Alternately, at least a first signal input connector may be mounted on the circuit board having a signal conductor coupled to one of the equal length, electromagnetically coupled strip lines for receiving a signal from the signal source.

The objects, advantages, and novel features of the present invention are apparent from the following detailed description when read in conjunction with appended claims and attached drawings.

BRIEF DESCRIPTION OF THE DRAWING FIGS.

FIG. 8 is a perspective view of various applications of one of the probe holders of the deskew fixture according to the present invention.

DETAILED DESCRIPTION OF THE PREFERRED EMBODIMENT

Figure 1:
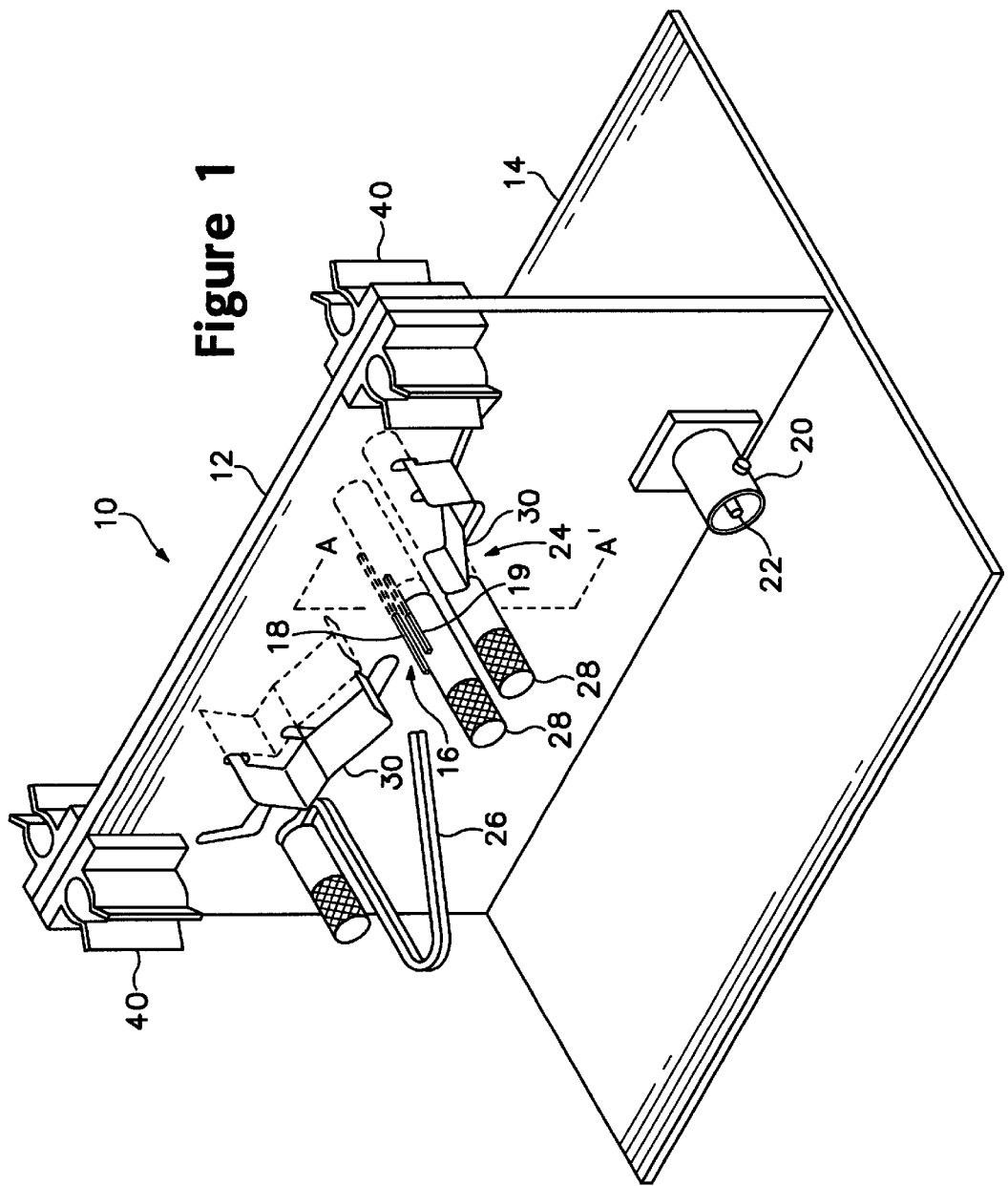
FIG. 1 is a perspective view illustrating a first embodiment of the deskew fixture according to the present invention.

Referring to FIG. 1, there is shown a perspective view of a first embodiment of the deskew fixture 10 of the present invention. The deskew fixture has a multilayer circuit board 12 that is preferably attached in a vertical orientation to a base 14. Pairs of mirrored signal launch contacts 16, in the form of square pin contacts 18 and 19, are positioned in through holes formed in the circuit board 12 such that the square pins 18 and 19 extend from the opposing sides of the circuit board 12 forming the mirrored launch contacts 16. The longer square pin contacts 18 are coupled to electrical ground and the shorter square pin contacts 19 are connected via coupled, equal length, electromagnetically coupled strip lines to a signal source. The signal source provides a high slew rate signal that is coupled via the signal launch contacts 16 to a signal probing tip of a measurement probe. The high slew rate signal may be provided by an external signal source coupled to the deskew fixture via a BNC-type input connector 20. The center conductor 22 of the input connector is connected to the equal length, electromagnetically coupled strip lines formed on an inner layer of the circuit board 12. The signal launch contacts 16 may also be implemented by mirrored contact pads on either side of the circuit board 12 or a combination of both the square pin contacts 18 and 19 and the contact pads.

The embodiment of FIG. 1 illustrates two types of probe holders 24 and 26 for supporting measurement probes on the circuit board 12. The first probe holder 24 has a support member 28 in the form of a support post extending from the surface of the circuit board 12 that supports the measurement probe. A biasing spring 30 extends outward from the circuit board 12 adjacent to the support member 28 that applies a force on the measurement probe to capture the probe between the support member 28 and the biasing spring 30. The structure of the biasing spring 30 will be described in greater detail below. The other of probe holder 26 is formed of a multiple folded spring wire producing an attachment member 32 connected by support members 34 to spring tensioned support arms 36. Cable retainers 40 may be attached to the circuit board 12 for receiving the coaxial cables extending from the measurement probe heads.

Figure 2:
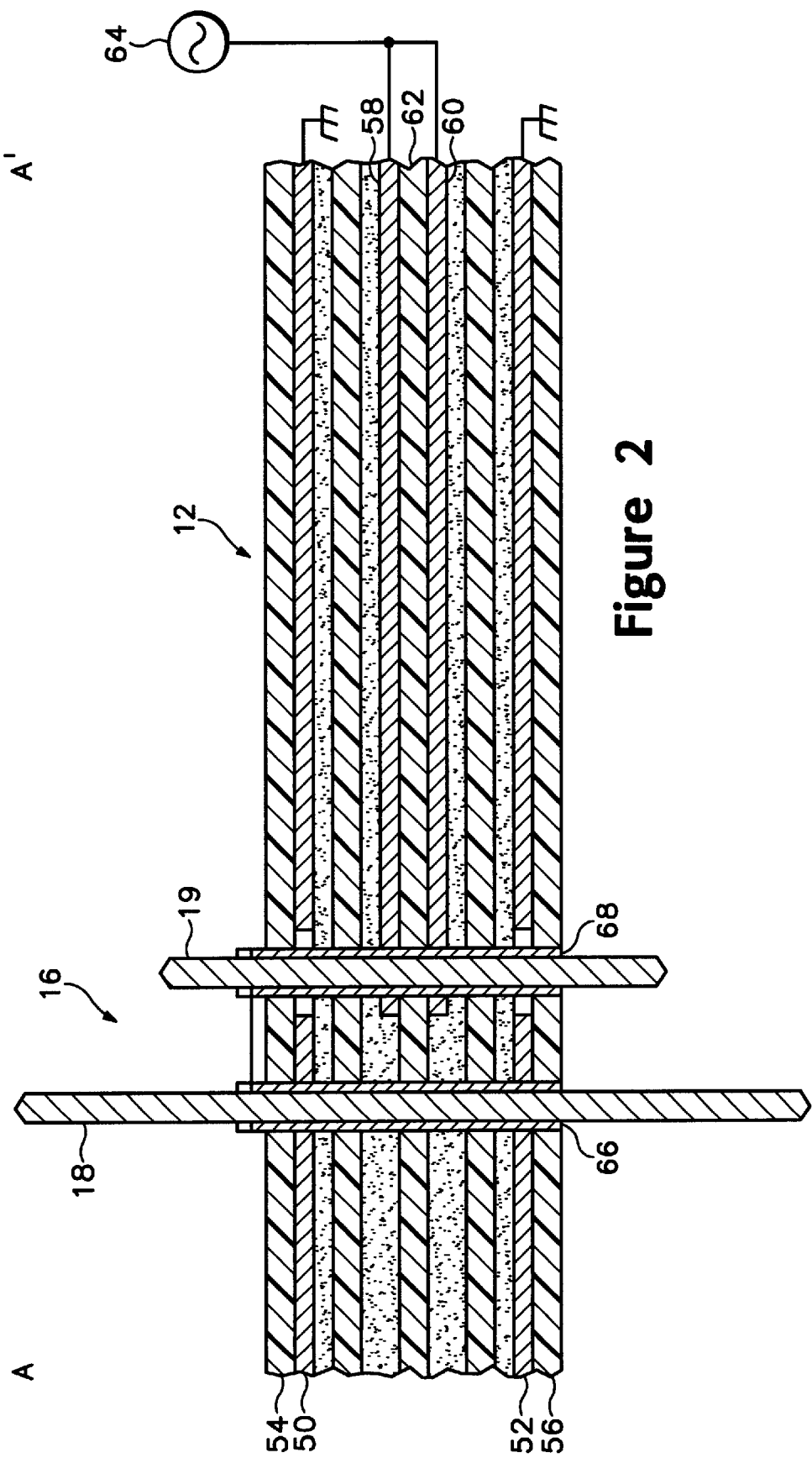
FIG. 2 is a representative cross-sectional view along line A–A' of the circuit board 12 showing the electrical connections to the mirrored launch contacts in the deskew fixture according to the present invention.

FIG. 2 is a representative cross-sectional view along line A–A' of the circuit board 12 showing the electrical connections to the mirrored launch contacts 14. The circuit board 12 is formed of multiple layers of circuit board material, such as FR4, Teflon®, and the like, that are glued together. The circuit board 12 illustrated in FIG. 2 has five dielectric layers and six conductive layers but any number of dielectric and conductive layers may be incorporated in the circuit board 12 of the deskew fixture 10. Conductive ground plane layers 50 and 52 is deposited on the interior surfaces of the outer circuit board layers 54 and 56. The ground plane layers 50 and 52 are coupled to electrical ground. Equal length strip lines 58 and 60 are formed on the opposing surfaces of the middle circuit board layer 62 with the strip lines 58 and 60 stacked on top of each other and separated by the circuit board layer 62. The strip lines 58 and 60 are coupled to the signal source 64 that provides the very fast stewing edge to the square pin contacts 19. In the preferred embodiment, the signal source is a Rambus® square wave clock signal. A delay is present at the launch point of the clock signal onto the strip lines 58 and 60 due to the thickness of the circuit board layer 62. The stacked orientation of the strip lines 58 and 60 electromagnetically couples the signals on the respective lines through the circuit board layer 62. The resulting coupling of the strip lines eliminates the signal delay at the signal launch contacts 16. Plated through holes 66 and 68 are formed in the circuit board 12 that receive the square pins 18 and 19 of the signal launch contacts 16. Through hole 66 is electrically coupled to the ground plane layers 50 and 52 and the through hole 68 is electrically coupled to the strip lines 58 and 60. Termination circuitry 69 (shown in FIG. 4) is formed on the top surface of the circuit board to terminate the square pin contact 19 of the signal launch contacts 16 in the characteristic impedance of the equal length, electromagnetically coupled strip lines 58 and 60.

Figure 3:
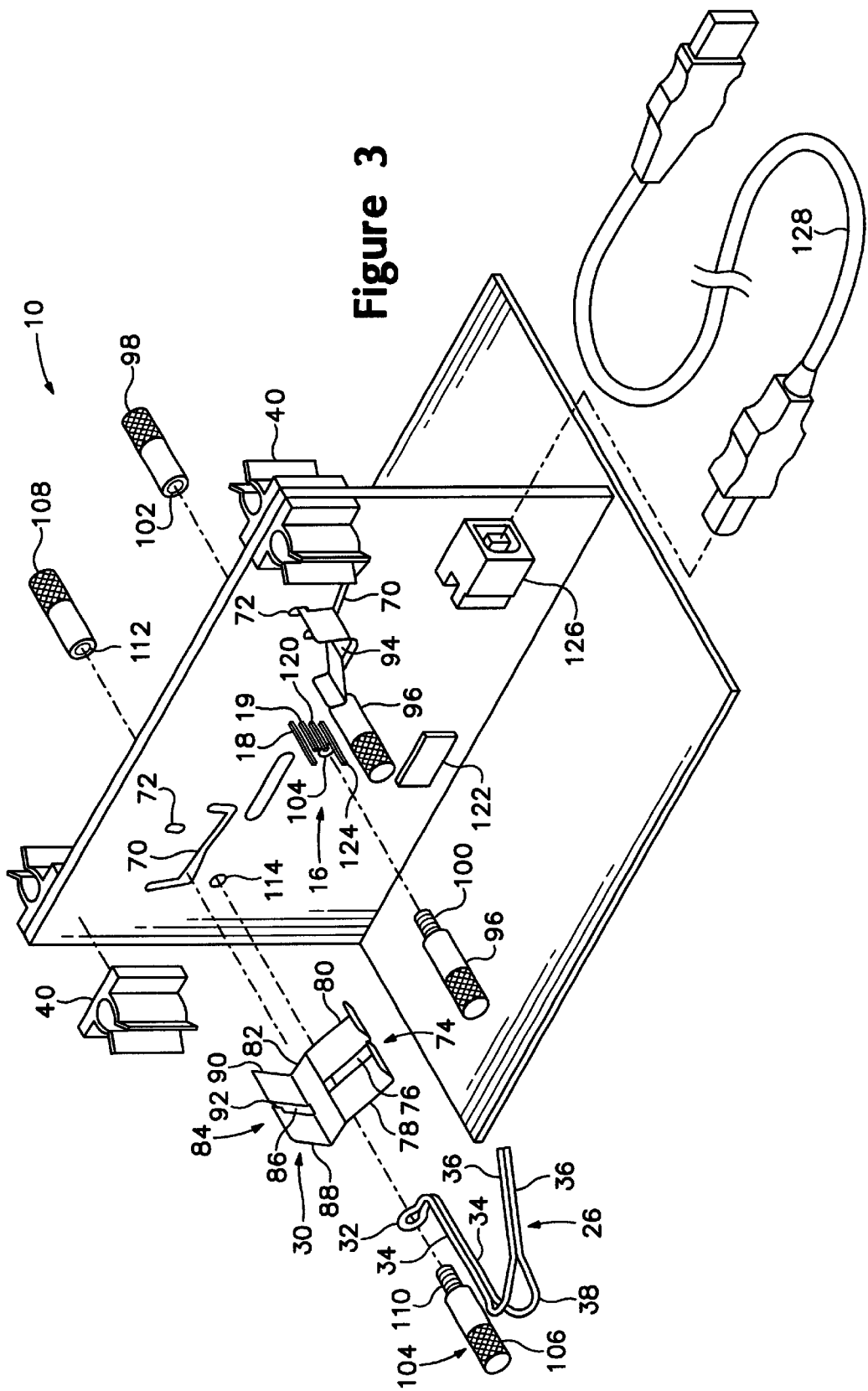
FIG. 3 is a partially exploded perspective view illustrating the preferred embodiment of the deskew fixture according to the present invention.

Referring to FIG. 3, there is shown a partially exploded perspective view of the preferred embodiment of the deskew fixture 10 of the present invention. Like elements from the previous drawings are labeled the same in FIG. 3. Elongated slots 70 are formed in the circuit board 12 that receives the biasing springs 30 of the probe holder 24. Detent apertures 72 are also formed in the circuit board 12 adjacent to the elongated slots 70. The biasing spring 30 has a cantilever spring member 74 with a slot 76 formed therein defining cantilever springs 78 and 80. The cantilever springs 78 and 80 extend from a spline member 82. Extending in a direction that is approximately vertical to the spline member 82 is a support member 84. The support member has a slot 86 formed therein that is axially aligned with the cantilever spring slot 76 and defines cantilever supports 88 and 90. A detent member 92 extends into the slot 86 from one of the cantilever supports 88 and 90. The biasing spring 30 is inserted into the elongated slot 70 such that circuit board 12 is centered over the slots 76 and 86 with cantilever spring 78 and cantilever support 88 on one side of the circuit board 12 and the cantilever spring 80 and cantilever support 90 on the other side of the circuit board 12. The biasing spring 30 is moved forward in the slot 70 and rotated upward to engage the detent member 92 within the detent aperture 72 resulting in a latched biasing spring as shown by biasing spring 94.

The support members 28 of the probe holders 24 have male and female portions 96 and 98 that are formed of a hard material, such as metal, ABS plastic or the like. The male portions 96 have a threaded shank 100 at one end that is longer than the thickness of the circuit board 12. The female portions 98 have a threaded aperture 102 at one end that receives the threaded shank 100 of the male portions 96. Apertures 104 are formed in the circuit board 12 adjacent to the biasing springs 30 and 94 that receive the threaded shank 100 of the male portions 96 of the support member 28. The threaded shanks 100 extending from the other side of the circuit board 12 are threaded into the threaded apertures 102 of the female portions 98 of the support member 28. The male and female portions 96 and 98 are tightened against the circuit board 12.

The probe holders 26 are mounted on the circuit board 12 using securing members 104 similar to the support members 28. The securing members 104 have male and female portions 106 and 108 with the male portion 106 having a threaded shank 110 extending from one end and the female portion having a threaded aperture 112 at one end. The threaded shank 110 is inserted through the attachment member 32 of the probe holder 26 and inserted through an aperture 114 formed in the circuit board 12. The threaded shank 110 is threaded into the threaded aperture 112 and tightened to secure the probe holder 26 to the circuit board 12. The probe holder 26 is shown with one end of the spring tensioned support arms 36 being flared outward 38 for receiving the measurement probe. The illustrated probe holder 26 is one possible configuration and other configurations are possible that may include additional folds in the wire or different flaring arrangements for the spring tensioned support arms 36.

The preferred embodiment of the deskew fixture 10 includes two additional pairs of mirrored signal launch contacts 16. The shorter square pin contacts 120 of the signal launch contacts 16 receives a negative signal from the signal source 122 and the longer square pin contact 124 is coupled to electrical ground. The signal source 122 is incorporated onto the circuit board 12 as represented by the high slew rate Rambus® clock signal integrated circuit device. The signal source 122 generates both positive and negative clock signals. The negative signal from the signal source 122 is connected to the square pin contact 120 by equal length, electromagnetically coupled strip lines like the previously described strip lines 58 and 60. The positive signal is coupled by the strip lines 58 and 60 to the shorter square pin 19. The positive and negative strip lines have the same length between the signal source 122 and the respective signal launch contacts 19 and 120 to provide time aligned positive and negative signals to the signal launch contacts 16. A power connector 126 is mounted on the circuit board 12 that receives voltage power inputs and ground via a power cable 128. In the preferred embodiment, the power connector 126 and cable 128 are Universal Serial Bus (USB) devices. The USB cable 128 is plugged into a USB port on the oscilloscope or other type device having a USB port.

Figure 4:
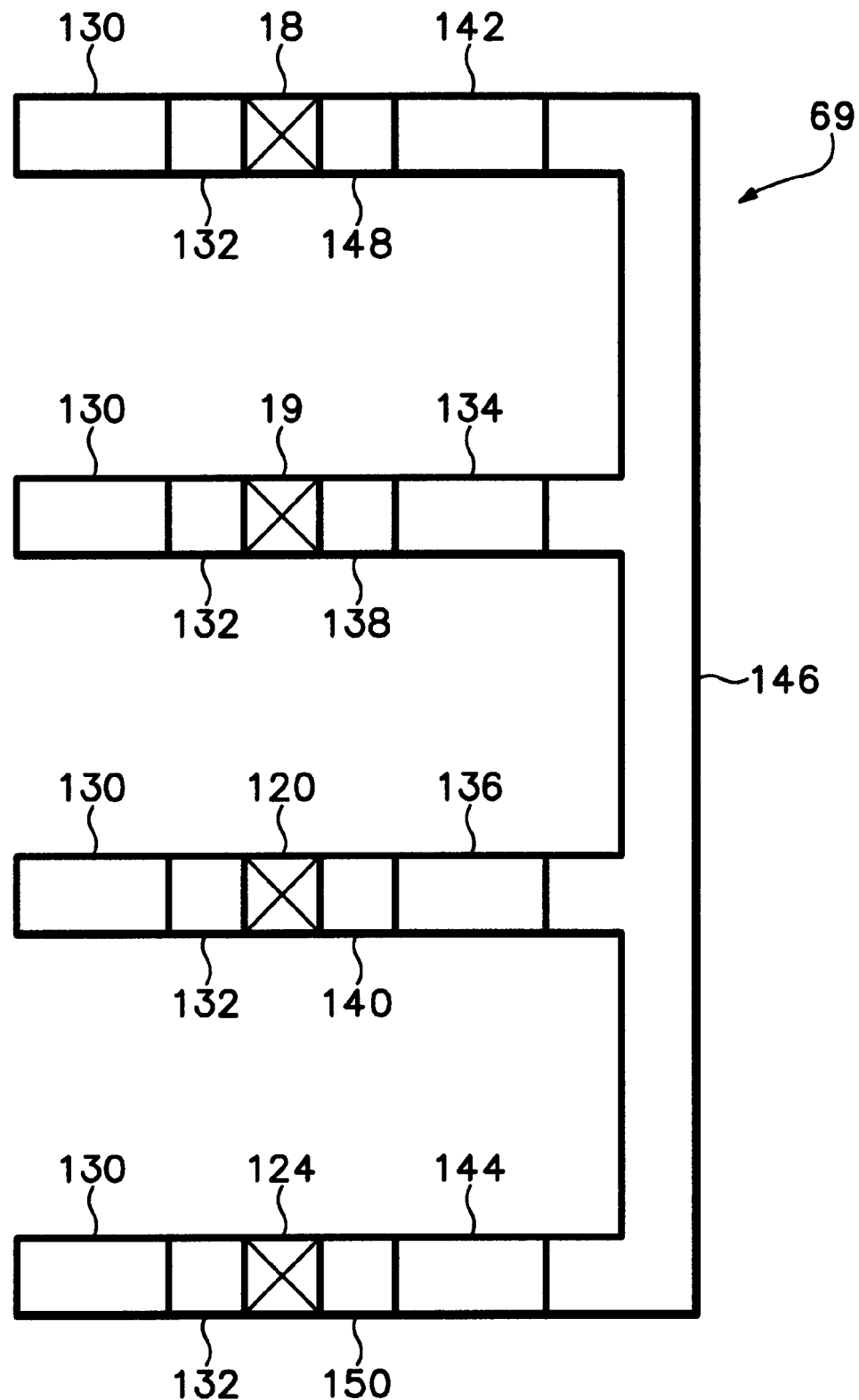
FIG. 4 is a plan view of one side of the circuit board illustrating the termination circuitry of the signal launch contacts of the deskew fixture according to the present invention.

FIG. 4 is a plan view of one side of the circuit board illustrating the termination circuitry 69 of the signal launch contacts 16 in the characteristic impedance of the strip lines coupling the positive and negative signals from the signal source 122. The view of FIG. 4 also shows one side of mirrored contact pads 130 used for measurement probes having very short needle probing tips. The contacts pads 130 are electrically coupled to the square pins contacts 18, 19, 120 and 124 via conductive runs 132 formed on the surface of the circuit board 12. Termination resistors 134 and 136 are coupled to the respective signal launch contacts 19 and 120 via conductive runs 138 and 140. The other ends of the termination resistors 134 and 136 are respective coupled to one side of capacitors 142 and 144 via conductive run 146. The other ends of the capacitors 142 and 144 are coupled to electrical ground via conductive runs 148 and 150 respectively coupled to the square pin contacts 18 and 124.

Figure 5A:
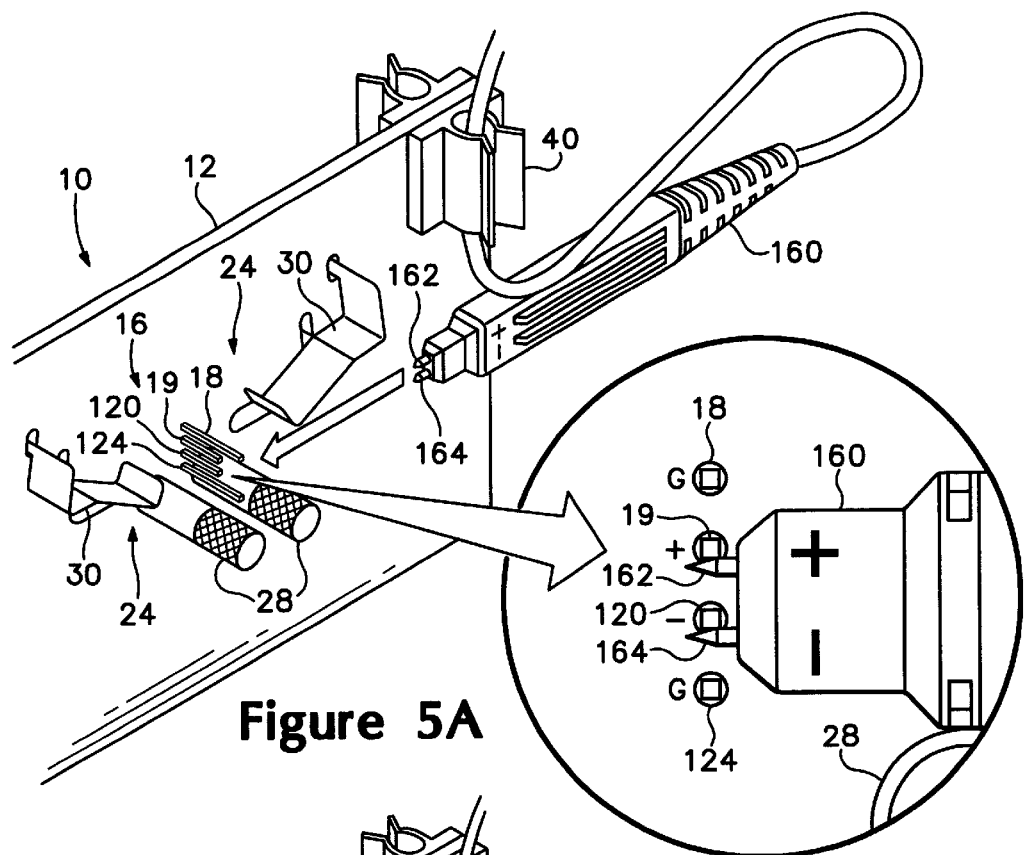
FIGS. 5A and 5B illustrate the mounting of a differential measurement probe to the deskew fixture according to the present invention.
Figure 5B:
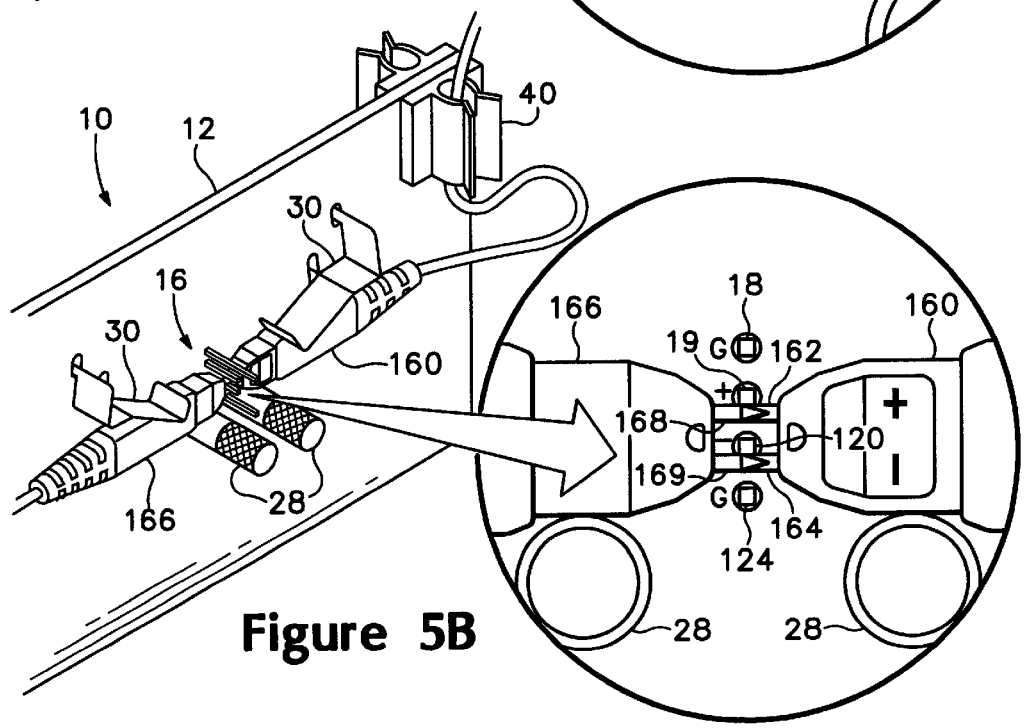

The deskew fixture 10 of the present invention accepts numerous types of measurement probes having various types of probing tips. FIGS. 5A and 5B illustrate the mounting of a differential measurement probe 160 having positive and negative marked needle point probing tips 162 and 164 on the deskew fixture 10. The mirrored signal launch contacts 16 include the ground square pins 18 and 124 and the positive and negative square pins 19 and 120 that receive the positive and negative signals from the signal source 122. The measurement probe 160 is positioned on the deskew fixture 10 using one of the probe holders 24 mounted on the circuit board 12. The probe 160 is positioned in the probe holder 24 with a portion of the probe resting on the support member 28 and the positive probing tip 162 engaging the positive square pin and the negative probing tip engaging the negative square pin 120. The biasing spring 30 applies a downward force on the probe 160 causing an upward rotation force on the probe 160 about the probe-support member interface and providing a positive engagement of the probing tips 162 and 164 on the square pins 19 and 120. A second differential measurement probe 166 is positioned in the same manner on the other probe holder 24 as shown in FIG. 5B. The probing tips 132 and 168 and 134 and 169 of the differential measurement probes 160 and 166 are positioned against each other to provide minimal distances between the tips. Two additional differential measurement probes can be positioned on the probe holders mounted on the other side of the circuit board 12. The probing tips of all four differential measurement probes receive the positive and negative signal with minimal timing delay due to the construction of the deskew fixture. The coupled strip lines providing the positive and negative signals from the signal source to the contacts 19 and 120 are the same length. Each strip line of the coupled strip lines couples the signal to one of the two sides of the circuit board 12. The combination of these structures assures a minimal amount of timing delay between the launch contacts on either side of the circuit board 12.

Figure 6:
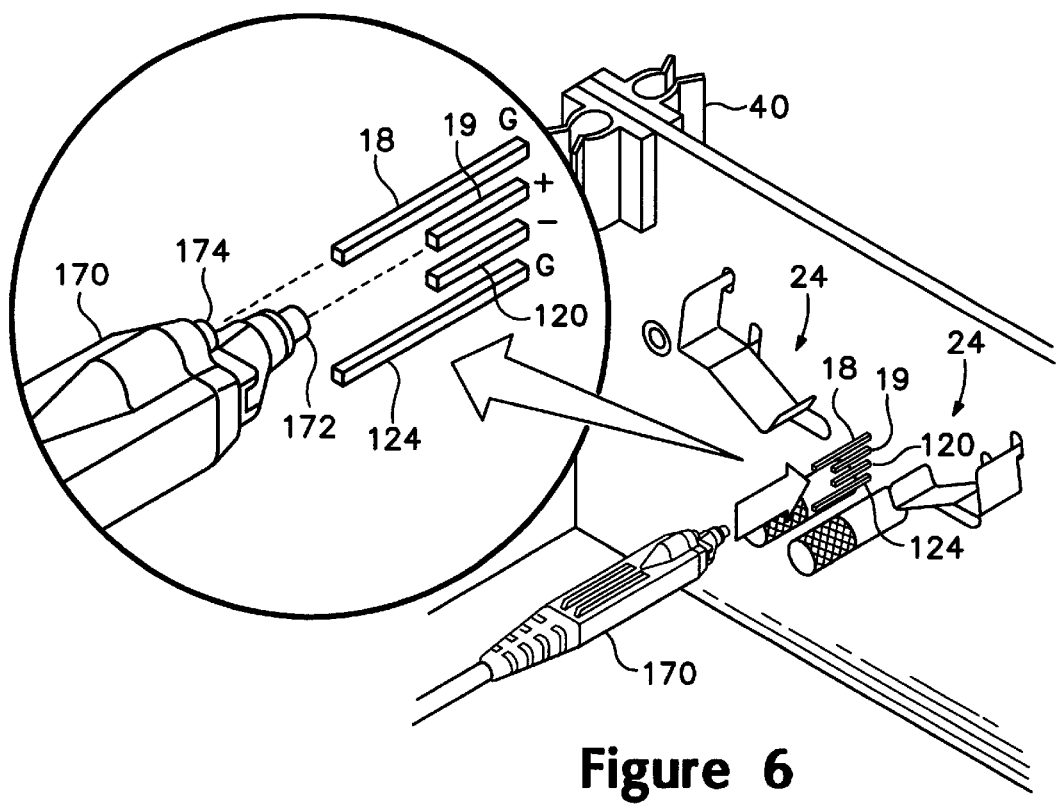
FIG. 6 illustrates the mounting of a socket tipped, single ended measurement probe to the deskew fixture according to the present invention.

FIG. 6 illustrates the mounting of a single ended measurement probe 170 having socket type probing tips 172 and 174. The signal probing tip 172 extends from the end of the measurement probe with the ground tip 174 extending from the probe at a distance back of the signal probing tip 172. The socket probing tips 172 and 174 of the measurement probe 170 are respectively inserted onto the square pins 19 and 18. A second socket type signal ended measurement probe is inserted onto the mirrored square pin contacts on the opposite side of the circuit board.

The socket type measurement probe 170 in FIG. 6 illustrates the signal probing tip 172 and the ground probing tip 174 at different distances from the end of the probe. This requires different length square pin contacts 18 and 19. The deskew fixture 10 maybe provided with equal length signal and ground square pin contacts for measurement probes having the socket type probing tips that extend the same distance from the probe. The deskew fixture 10 also accommodates socket type differential measurement probes with the differential socket tips inserted on the positive and negative square pins 19 and 120. The deskew fixture 10 can accommodate up to six probes at one time with four of the probes being the differential type of FIGS. 5A and 5B and two socket type probes of FIG. 6.

Figure 7A:
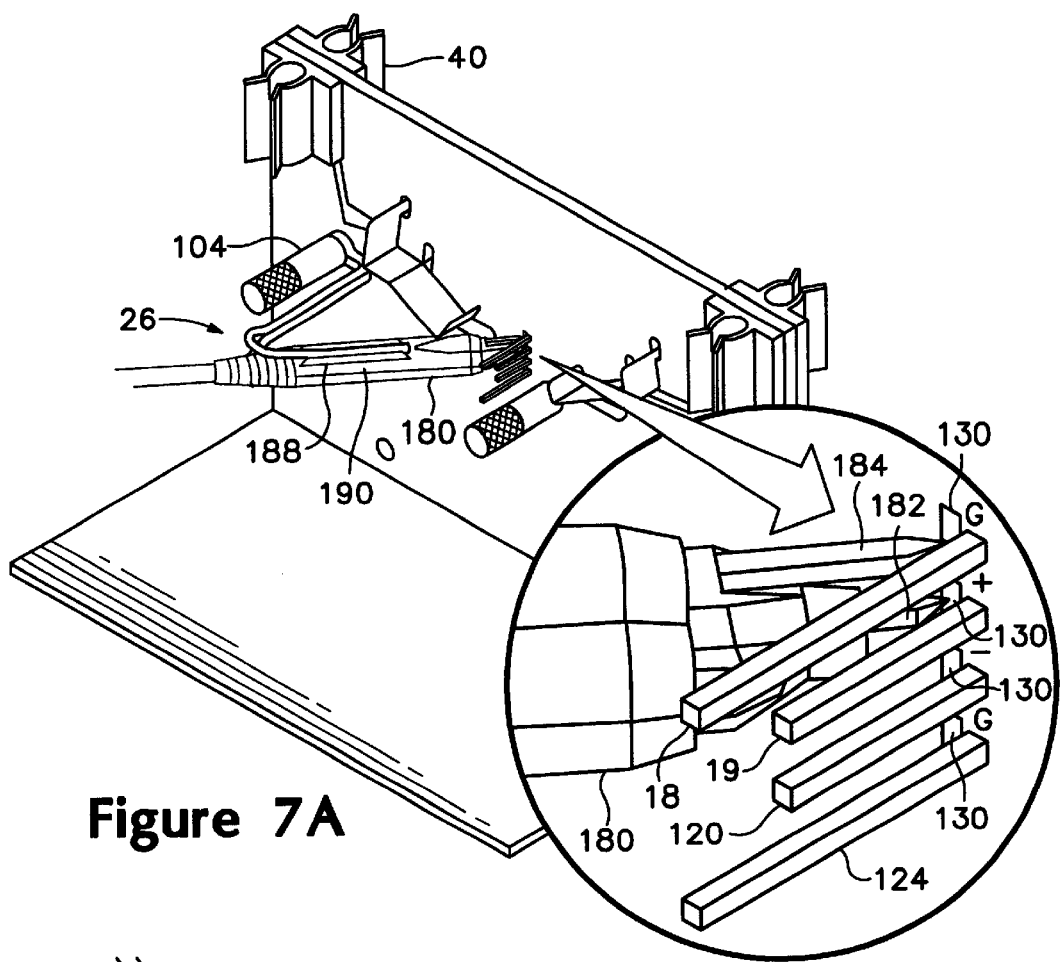
FIGS. 7A and 7B illustrate the mounting of a very small needle point tipped single ended measurement probe to the deskew fixture according to the present invention.
Figure 7B:
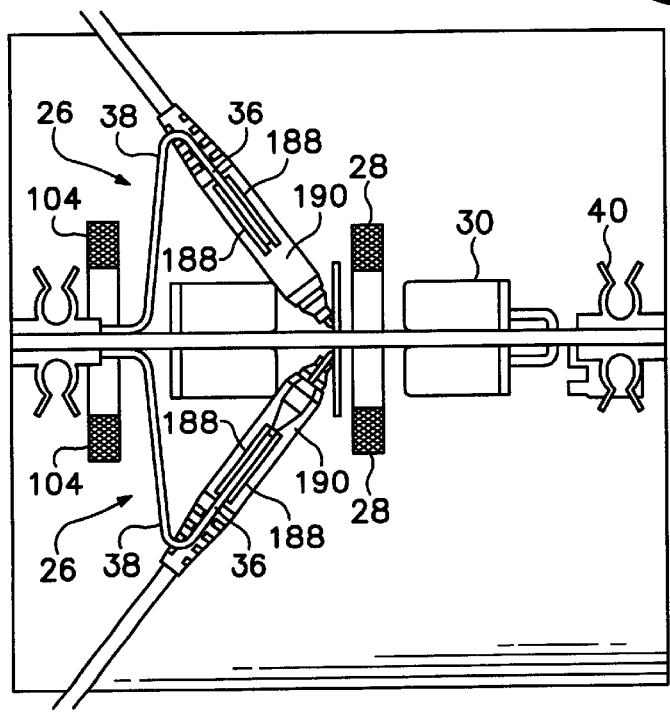

FIGS. 7A and 7B illustrate the mounting of a single ended measurement probe 180 having very small needle point probing tips 182 and 184. Probing tips are becoming increasing smaller to reduce inductive and capacitive loading as the frequency bandwidth of measurement probes increase higher into the gigahertz range. The lengths of the probing points for these types of probes are on the order of 0.035 inches which are to small to use with the probe supports 24. The deskew fixture 10 accommodates very small probing point measurement probe 180 using the mirrored contact pads 130 on either side of the circuit board 12 and the probe support 26. The contact pads 130 are electrically coupled to the square pins contacts 18, 19, 120 and 124. Pairs of raised ribs 188 are formed on opposing flat surfaces 190 of the measurement probe 180 forming a trough that receives the spring tensioned support arms 36 of the probe holder 26. The probe 180 is inserted into the probe holder 26 via the flared end 38 of the support arms 36. The probe holder 26 and the probe 180 are positioned so that the probing tips 182 and 184 engage the contacts pads 130 on the circuit board 12. A second measurement probe 192 is mounted on the opposite side of the circuit board 12 using another probe holder 26 as illustrated in FIG. 7B. The second measurement probe 182 is positioned so that its probing tips engage the mirrored contacts pads 130 on the opposite of the circuit board 12.

The probe holder 26 may also be used separately from the deskew fixture 10 for other types of probing applications. FIG. 8 illustrates examples of the probe holder 26 supporting a measurement probe in these applications. The probe holder 200 may be attached to a circuit board 202 populated with various passive and active components 204 and 206. The circuit board 202 is laid out with through holes formed in the board that accepts a probe holder securing member 208. The securing member 208 may be similar to the previously described securing member 104 having the male and female portions 110 and 112. Alternately, the securing member may include a PEM® nut secured to the back side of the circuit board 202 and the male portion 110 of the securing member 104 with the threaded shank. The threaded shank is inserted through the attachment member 32 of the probe holder and threaded into the PEM and tightened to secure the probe holder to the circuit board 202.

The probe holder may also be secured directly to the circuit board 202 as represented by probe holder 210 using an adhesive, such a hot glue, epoxy or the like. In this example, the circuit board is laid out with open areas of sufficient size to accept the attachment member 32 of the probe holder 210. The probe holder may also be mounted on a flexible probing arm 212 that is attached to the circuit board 202. The circuit board 202 is laid out with one or more probe arm attachment locations 214. The probe arm may be secured to the circuit board 202 in a similar manner to the probe holder 200. The circuit board attachment location 214 has a through hole formed therein that receives a threaded shank extending from the end of the flexible probing arm. A nut or similar type of threaded device is threaded on the shank from the reverse side of the circuit board and tightened to the board. The other end of the flexible probing arm may include a threaded aperture that receives the male portion 110 of the securing member 104. The threaded shank 110 of the male portion of the securing member is inserted through the attachment member of the probe holder 216 and threaded into the threaded aperture in the probe arm and tightened. The attachment member of the probe holder may also be modified so that it can be inserted into an aperture formed in the end of the flexible probing arm.

There may be a need to insulate the probe holder from circuitry on the circuit board 202. An insulating boot having an aperture therein that allows for the male portion 110 of the securing member to be inserted therethrough may be placed over the attachment member of the probe holder. It is also possible to make the probe holder 26 out of an insulating material having the attachment member, support members and flared end spring tensioned support arms structural elements as previously described.

A deskew fixture has been described having a multilayer circuit board supporting multiple probe holders or each side of the circuit board for mounting measurement probes on the deskew fixture. The circuit board has pairs of mirrored signal launch contacts disposed on the opposing sides of the board. In a first embodiment, the circuit board has a first pair of the contacts coupled to electrical ground and a second pair of contacts connected via equal length, electromagnetically coupled strip lines to a signal source. The signal source is preferably incorporated on the circuit board of the deskew fixture. Alternately, the signal source may be external to the deskew fixture which is then provided with an electrical connector for receiving a signal from the external signal source. Additional pairs of mirrored signal launch contacts are provides on the circuit board to allow for deskewing differential measurement probes. The signal source provides positive and negative signals to corresponding positive and negative mirrored signal launch contacts via equal length, electromagnetically coupled strip lines. Two types of probe holders support the measurement probe on the deskew fixture. One type of probe holder has a support member and a biasing spring extends from the side of the circuit board with the biasing spring applying a force on the measurement probe to capture the measurement probe between the support member and the spring. The other type of probe holder is a multiple folded spring wire forming an attachment member connected by support members to spring tensioned support arms with one end of the spring tensioned support arms flared outward for receiving the measurement probe.

It will be obvious to those having skill in the art that many changes may be made to the details of the above-described embodiments of this invention without departing from the underlying principles thereof. The scope of the present invention should, therefore, be determined only by the following claims.

What is claimed is:

1. A deskew fixture for measurement probes having probing contacts comprising:
    a multilayer circuit board having opposing sides;
    pairs of mirrored signal launch contacts disposed on the opposing sides of the circuit board with a first pair of contacts coupled to electrical ground and a second pair of contacts connected via equal length, electromagnetically coupled strip lines to a signal source; and
    at least first and second probe holders with one probe holder disposed on one side of the circuit board and the other probe holder disposed on the other side of the circuit board for supporting the measurement probes on the circuit board with the probing contacts of the measurement probes coupled to the signal launch contacts.

2. The deskew fixture as recited in claim 1 wherein the signal launch contacts comprise square pin contacts extending from the opposing sides of the circuit board.

3. The deskew fixture as recited in claim 1 wherein the signal launch contacts comprise contact pads formed on the opposing sides of the circuit board.

4. The deskew fixture as recited in claim 1 wherein the signal launch contacts comprise square pin contacts extending from the opposing sides of the circuit board and contact pads formed adjacent to and electrically coupled to the square pin contacts.

5. The deskew fixture as recited in claim 1 wherein each probe holder comprises a support post extending from the side of the circuit board for supporting the measurement probe and a biasing spring extending from the side of the circuit board adjacent to the support member for applying a force on the measurement probe to capture the measurement probe between the support member and the spring.

6. The deskew fixture as recited in claim 5 wherein the biasing spring further comprises a cantilever spring member having a slot formed therein defining first and second cantilever springs extending from a spine member and a support member extending in an approximate vertical direction from the spine member having a slot formed therein axially aligned with the cantilever spring member slot defining first and second cantilever spring supports and a detent member extending into the slot with the cantilever spring member positioned in an elongated slot formed in the circuit board such that the first and second cantilever springs are positioned on the opposing sides of the circuit board and the detent member is received in a detent aperture formed in the circuit board.

7. The deskew fixture as recited in claim 1 wherein each probe holder comprises a multiple folded spring wire forming an attachment member connected by support members to spring tensioned support arms with one end of the spring tensioned support arms flared outward for receiving the measurement probe.

8. The deskew fixture as recited in claim 1 further comprising multiple probe holders disposed on each side of the circuit board.

9. The deskew fixture as recited in claim 1 wherein the signal source generates positive and negative signals with the second pair of signal launch contacts receiving the positive signal and a third pair of contacts receiving the negative signal via equal length, electromagnetically coupled strip lines connected to the signal source.

10. The deskew fixture as recited in claim 1 further comprising at least a first signal input connector mounted on the circuit board having a signal conductor coupled to the equal length, electromagnetically coupled strip lines for receiving a signal from the signal source.

11. The deskew fixture as recited in claim 1 further comprising the signal source mounted on the circuit board.

12. The deskew fixture as recited in claim 1 further comprising a voltage input connector mounted on the circuit board receiving voltage power inputs coupled to the signal source.

13. The deskew fixture as recited in claim 12 wherein the voltage input connector is a USB connector.

14. A deskew fixture for single ended and differential measurement probes having socket and probing point contacts comprising:
    a multilayer circuit board having opposing sides;
    a signal source mounted on the circuit board generating positive and negative going signals;
    pairs of mirrored signal launch contacts disposed on the opposing sides of the circuit board with a first pair of contacts coupled to an electrical ground, a second pair of contacts connected via equal length, electromagnetically coupled strip lines to a positive going signal from a signal source and a third pair of contacts connected via equal length, electromagnetically coupled strip lines to a negative going signal from the signal source; and
    at least first and second probe holders with one probe holder disposed on one side of the circuit board and the other probe holder disposed on the other side of the circuit board for supporting the measurement probes on the circuit board with the probing contacts of the measurement probes coupled to two of the three signal launch contacts.

15. The deskew fixture as recited in claim 14 wherein the signal launch contacts comprise square pin contacts extending from the opposing sides of the circuit board.

16. The deskew fixture as recited in claim 14 wherein the signal launch contacts comprise contact pads formed on the opposing sides of the circuit board.

17. The deskew fixture as recited in claim 14 wherein the signal launch contacts comprise square pin contacts extending from the opposing sides of the circuit board and contact pads formed adjacent to and electrically coupled to the square pin contacts.

18. The deskew fixture as recited in claim 14 wherein each probe holder comprises a support post extending from the side of the circuit board for supporting the measurement probe and a biasing spring extending from the side of the circuit board adjacent to the support member for applying a force on the measurement probe to capture the measurement probe between the support member and the spring.

19. The deskew fixture as recited in claim 18 wherein the biasing spring further comprises a cantilever spring member having a slot formed therein defining first and second cantilever springs extending from a spine member and a support member extending in an approximate vertical direction from the spine member having a slot formed therein axially aligned with the cantilever spring member slot defining first and second cantilever spring supports and a detent member extending into the slot with the cantilever spring member positioned in an elongated slot formed in the circuit board such that the first and second cantilever springs are positioned on the opposing sides of the circuit board and the detent member is received in a detent aperture formed in the circuit board.

20. The deskew fixture as recited in claim 14 wherein each probe holder comprises a multiple folded spring wire forming an attachment member connected by support members to spring tensioned support arms with one end of the spring tensioned support arms flared outward for receiving the measurement probe.

21. The deskew fixture as recited in claim 14 further comprising multiple probe holders disposed on each side of the circuit board.

22. The deskew fixture as recited in claim 14 further comprising a voltage input connector mounted on the circuit board receiving voltage power inputs coupled to the signal source.

23. The deskew fixture as recited in claim 22 wherein the voltage input connector is a USB connector.

24. A deskew fixture for single ended and differential measurement probes having socket and probing point contacts comprising:

a multilayer circuit board having opposing sides;

a signal source mounted on the circuit board generating positive and negative going signals;

pairs of mirrored signal launch square pin contacts and contact pads formed adjacent to and electrically coupled to the square pin contacts disposed on the opposing sides of the circuit board with a first pair of contacts coupled to an electrical ground, a second pair of contacts connected via equal length, electromagnetically coupled strip lines to a positive going signal from a signal source and a third pair of contacts connected via equal length, electromagnetically coupled strip lines to a negative going signal from the signal source; and at least first and second probe holders with one probe holder disposed on one side of the circuit board and the other probe holder disposed on the other side of the circuit board for supporting the measurement probes on the circuit board with the probing contacts of the measurement probes coupled to two of the three signal launch contacts.

25. The deskew fixture as recited in claim 24 wherein each probe holder comprises a support post extending from the side of the circuit board for supporting the measurement probe and a biasing spring extending from the side of the circuit board adjacent to the support member for applying a force on the measurement probe to capture the measurement probe between the support member and the spring.

26. The deskew fixture as recited in claim 25 wherein the biasing spring further comprises a cantilever spring member having a slot formed therein defining first and second cantilever springs extending from a spine member and a support member extending in an approximate vertical direction from the spine member having a slot formed therein axially aligned with the cantilever spring member slot defining first and second cantilever spring supports and a detent member extending into the slot with the cantilever spring member positioned in an elongated slot formed in the circuit board such that the first and second cantilever springs are positioned on the opposing sides of the circuit board and the detent member is received in a detent aperture formed in the circuit board.

27. The deskew fixture as recited in claim 24 wherein each probe holder comprises a multiple folded spring wire forming an attachment member connected by support members to spring tensioned support arms with one end of the spring tensioned support arms flared outward for receiving the measurement probe.

28. The deskew fixture as recited in claim 24 further comprising multiple probe holders disposed on each side of the circuit board.

29. The deskew fixture as recited in claim 24 further comprising a voltage input connector mounted on the circuit board receiving voltage power inputs coupled to the signal source.

30. The deskew fixture as recited in claim 29 wherein the voltage input connector is a USB connector.

* * * * *